United States Patent [19]

Ohba et al.

[11] Patent Number: 4,952,958
[45] Date of Patent: Aug. 28, 1990

[54] PHOTO-SENSITIVE PRINTING PLATE AUTOMATIC DEVELOPING APPARATUS

[75] Inventors: Hisao Ohba; Kenji Kunichika, both of Shizuoka, Japan

[73] Assignee: Fuji Photo Film Co., Ltd., Kanagawa, Japan

[21] Appl. No.: 366,389

[22] Filed: Jun. 15, 1989

[30] Foreign Application Priority Data

Jun. 15, 1988 [JP] Japan ................. 63-147849
Jun. 27, 1988 [JP] Japan ................. 63-158364

[51] Int. Cl.$^5$ .................... G03D 3/04; G03B 3/08
[52] U.S. Cl. .................... 354/322; 354/325; 354/328
[58] Field of Search ............ 354/317, 320, 321, 322, 354/324, 325, 328

[56] References Cited

U.S. PATENT DOCUMENTS

| | | | |
|---|---|---|---|
| 4,119,991 | 10/1978 | Martino | 354/320 |
| 4,148,576 | 4/1979 | Martino | 354/320 |
| 4,464,035 | 8/1984 | Schoering | 354/322 |
| 4,521,092 | 6/1985 | Ferrante | 354/328 |

FOREIGN PATENT DOCUMENTS 2075372A 11/1961 United Kingdom ................ 354/328
2087268A 5/1982 United Kingdom ................ 354/328

Primary Examiner—A. A. Mathews
Attorney, Agent, or Firm—Sughrue, Mion, Zinn, Macpeak & Seas

[57] ABSTRACT

A photo-sensitive printing plate automatic developing apparatus for conveying a photo-sensitive printing plate upon which an image has been exposed, along a conveyor route while developing it in a developing tank, and then performing at least one of the following processes of washing, rinsing and desensitizing, is provided on the side of the developing tank from which the photo-sensitive printing plates are inserted, and is provided with a pair of insertion rollers that hold said photo-sensitive printing plate and conveys photo-sensitive printing plate downwards at an angle of 20° or less to the horizontal, and a pair of squeeze rollers to squeeze the developing solution on the surface of said photo-sensitive printing plates while holding and conveying them after they have been conveyed drawings, in a state where the maximum radius of curvature of the photo-sensitive printing plate in the developing solution of said developing tank is from 200 mm to 900 mm. Accordingly, the photo-sensitive printing plates can be conveyed so as to follow a smoothly curved path through the developing solution.

23 Claims, 4 Drawing Sheets

PHOTO-SENSITIVE PRINTING PLATE AUTOMATIC DEVELOPING APPARATUS

BACKGROUND OF THE INVENTION

1. Field of the Invention

This invention relates to a photo-sensitive printing plate automatic developing apparatus for conveying a photo-sensitive printing plate upon which an image has been exposed, along a conveyor path while developing it as a positive, a negative or a positive and negative type in a developing tank, and then performing at least one of the following processes of washing, rinsing and desensitizing.

2. Description of the Related Art

A photo-sensitive printing plate, such as a presensitized offset printing plate, upon which an image has been exposed, it sent to a photo-sensitive printing plate automatic developing apparatus and is conveyed to and processed in sequence, in a developing tank, a washing tank, a desensitizing tank and the like provided on the photo-sensitive printing plate automatic developing apparatus.

The photo-sensitive printing plates are rigid plates such as aluminum plates or plastic plates to which photo-sensitive substances have been applied to either one or both of the surface thereof.

Multiple guide rollers are provided inside said processing tanks, and these guide rollers guide the photo-sensitive printing plates and immerse them in the processing solutions.

Conventionally, the photo-sensitive printing plates are inserted in a substantially horizontal direction, and then conveyed by conveyor rollers located immediately before the developing tank, and then send downwards at a sharp angle by guide rollers, conveyed to the bottom of the developing tank by guide plates, and then sent up from the bottom and sent out from the developing tank.

However, because the photo-sensitive printing plate is formed from a highly rigid substance such as aluminum or plastic, there is the problem that excessive forces are applied to the photo-sensitive printing plate when it is inserted into the developing tank and conveyed downwards at a small radius of curvature, therefore resulting in damage to the photo-sensitive printing plate.

Moreover, when the photo-sensitive printing plate is conveyed in the developing tank, improper conveyance when the photo-sensitive printing plate is conveyed along a conveyor path having a small radius of curvature results in the problem of damage to the surface of the photo-sensitive printing plate.

SUMMARY OF THE INVENTION

It is therefore an object of the present invention to provide a photo-sensitive printing plate automatic developing apparatus that can convey the photo-sensitive printing plates along the conveyor path smoothly and without damage, and that can efficiently process the photo-sensitive printing plates in the tanks using the rollers and the sprays.

According to the present invention, a photo-sensitive printing plate automatic developing apparatus for developing a photo-sensitive printing plate upon which an image has been exposed, using the developing solution in a developing tank, while conveying said photo-sensitive printing plate along a conveyor path, and then performing at least one of the following processes of washing, rinsing and desensitizing, is provided with at least one pair of insertion rollers that hold and convey said photo-sensitive printing plate on the side from which said photo-sensitive printing plate is inserted into said developing tank, and disposed so as to send said photo-sensitive printing plate downwards at an angle of 20° or less to the horizontal; and a conveying device comprising at least one pair of squeeze rollers for squeezing the developing solution on the surface of said photo-sensitive printing plate and disposed so as to hold and convey said photo-sensitive printing plate in a state where said photo-sensitive printing plate in the developing solution of said developing tank has its maximum radius of a downward curvature in a range of 200 mm to 900 mm.

Accordingly, in this invention the photo-sensitive printing plate upon which an image has been exposed, is held between and downwards at an angle of 20° or less to the horizontal by the pair of insertion rollers and made to soak in the developing solution in the developing tank. At the bottom of the developing tank is the conveying device comprising at least one pair of squeeze rollers, which conveys the photo-sensitive printing plate through a minimum a radius of a downward curvature of from 200 mm to 900 mm, preferably from 200 mm to 600 mm, while the surface of the photo-sensitive printing plate is squeezed by said a pair of squeeze rollers. Used developing solution in the photo-sensitive layer is squeezed out by the squeeze rollers and fresh developing solution is supplied to the photo-sensitive layer so that developing of the printing plate is promoted. After having been conveyed up from the bottom of, and out of the developing tank, the photo-sensitive printing plate is conveyed by conveyor rollers of the following process and processed.

Moreover, in one aspect of this invention, the developing tank and/or the tank of a following process is provided with a film removing means to remove the photo-sensitive layer on the surface of the photo-sensitive printing plate. Accordingly, in this aspect, the photo-sensitive layer is completely removed from the plate surface.

This film-removing device can be a high-frequency vibration device that removes the photo-sensitive layer by transmitting vibration to the plate surface through the developing solution between the plate surface and a rubbing rubbing the plate surface.

The rubbing part can be a brush, a sponge or cloth or the like. More specifically, the method of rubbing can be a method whereby a roller-shaped rubber is rotated, a method whereby a plate-shaped rubber is reciprocally conveyed forwards and backwards and/or from side to side across the conveyor path, or a method whereby a roller-shaped or a plate-shaped rubbing material is rotated while being reciprocally conveyed forwards and backwards and/or from side to side across the conveyor path. Furthermore, more than one rubbing member can also be used.

The high-frequency vibration device can be high-frequency vibration device that vibrates the plate surface by using ultrasonic waves to vibrate the developing solution.

The present invention can therefore provide a photo-sensitive printing plate automatic developing apparatus that can convey the photo-sensitive printing plates along the conveyor path smoothly and without damage.

DESCRIPTION OF THE PREFERRED EMBODIMENT

Figure 1:
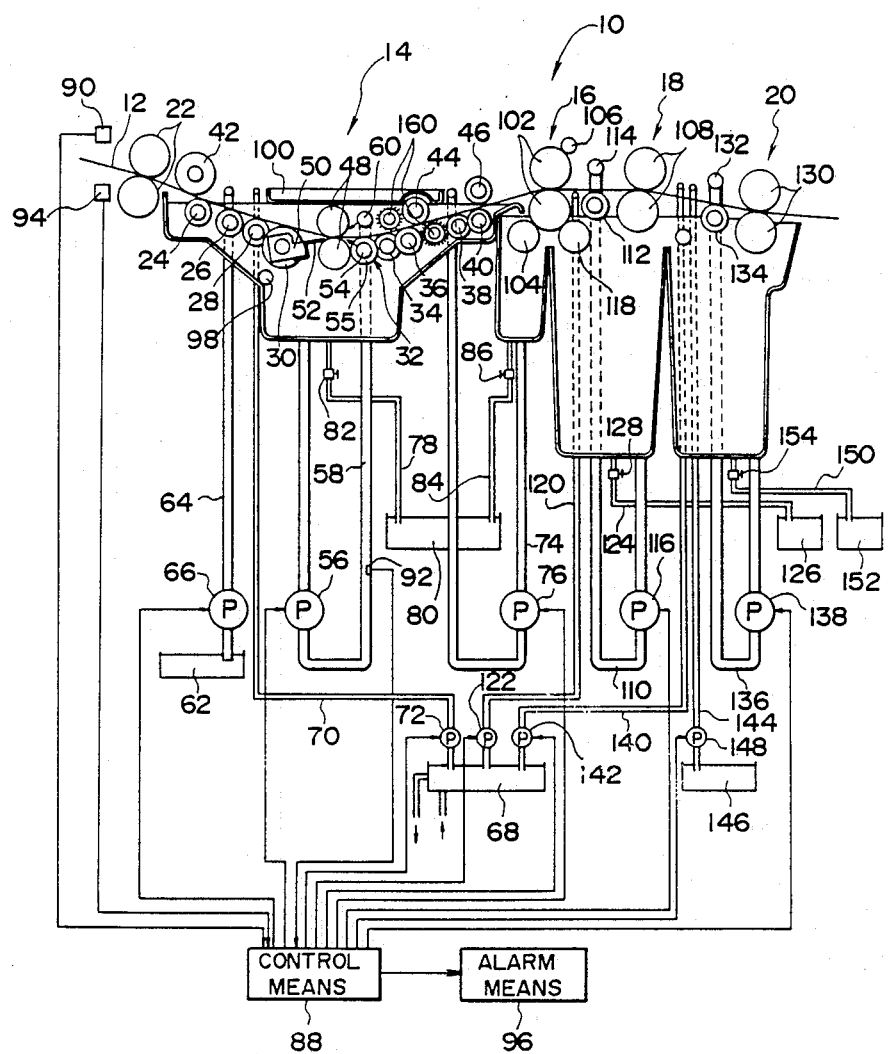
FIG. 1 is a diagrammatic illustration of the configuration of the photo-sensitive printing plate automatic developing apparatus of the present invention.

FIG. 1 is a diagrammatic illustration of the configuration of a photo-sensitive printing plate automatic developing apparatus 10 of the present invention.

The photo-sensitive printing plate automatic developing apparatus 10 is provided with a developing tank 14 that performs developing process of a photo-sensitive printing plate 12 (hereinafter referred to as the "PS plate") upon which an image has been exposed, a developing solution recovery tank 16 to recover developing solution overflowing from the developing tank 14, a water washing tank 18 to wash off developing solution adhering to the PS plate 12, and a rinsing tank or a desensitization processing tank 20 which applys rinsing solution or desensitizing solution to the PS plate 12.

As indicated in FIG. 1, the side from which the PS plate 12 is inserted into the developing tank 14 is provided with a pair of conveyor rollers 22. These conveyor rollers 22 are arranged so that the PS plate 12 upon which an image has been exposed by the exposing device (not indicated in the figure) is inserted between them.

The conveyor rollers 22 send the PS plate 12 downwards at an angle of 15° to the horizontal, towards the developing tank 14.

However, when processing high-sensitivity PS plates 12 or the like, the PS plate 12 is sent downwards at an angle of 15° or less to the horizontal so as to avoid fogging of the PS plate 12 due to pressure being applied to it before the developing process is complete. Also, if the length of the developing tank is reduced to make it more compact, the conveyor rollers are arranged so as to send the PS plate 12 downwards at an angle of between 10° and 20°.

The developing tank 14 has the top open and the bottom extending down to form a truncated and inverted V-shape. The developing tank 14 contains developing solution. Also, the developing tank 14 is provided with guide rollers 24, 26, 28, 34, 36, 38 and 40 following along the bottom wall portion. These guide rollers 24, 26, 28, 34, 36, 38 and 40 are split rollers in that they have rollers intermittently mounted on a shaft, and span between and are supported by a pair of side plates (not indicated in the figure).

Also, above the guide roller 24 is a guide roller 42 of a larger diameter than the guide roller 24. Above and horizontally offset from the guide roller 36 is a guide roller 44, and above the guide roller 40 is a guide roller 46. These guide rollers 42, 44 and 46 are the same split rollers as the guide roller 24 and are supported by a pair of side plates (not indicated in the figure).

In the middle part of the developing tank 14 and located between the guide roller 28 and the guide roller 34, is a pair of conveyor rollers 48 that function as squeeze rollers to squeeze the PS plate 12. The material of these conveyor rollers 48 can be silicon, neoprene, EPT or some other synthetic rubber, and has a vickers hardness number of between 15 and 60, preferably between 20 and 50, or more preferably between 40 and 50. The roller nip pressure of the pair of conveyor rollers 48 is from 1 to 10 kg/cm$^2$ and this pressure is transmitted by a roller nip screw coil spring pressing against the bearings of conveyor rollers 48. This pair of conveyor rollers 48 is rotatably supported by the side plates in the same manner as the guide rollers 24 through 46, and are rotated by a drive force transmitted from a drive means (not indicated in the figure).

Figure 2:
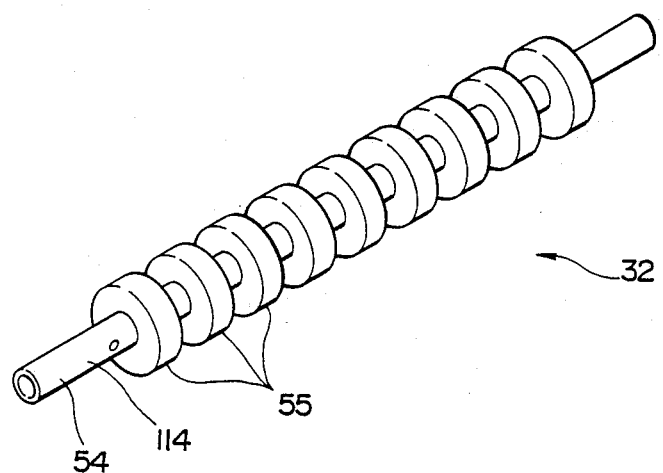
FIG. 2 is a diagrammatic illustration of a skewered roller of an embodiment of the present invention.
Figure 3:
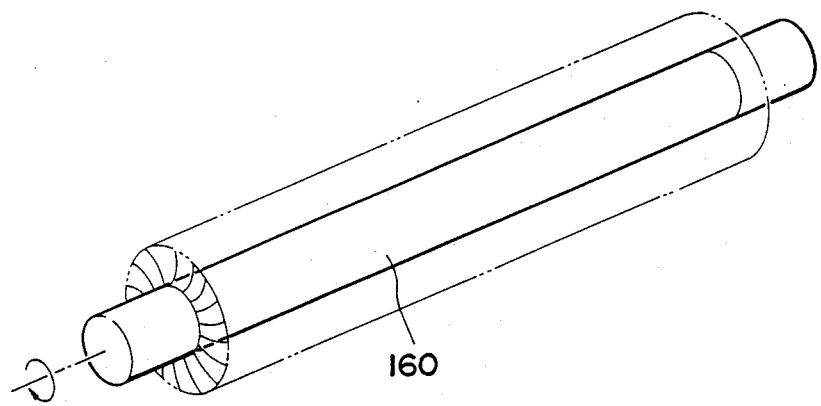
FIG. 3 is a diagrammatic illustration of a brush of an embodiment of the present invention.

Located between the conveyor rollers 48 and the guide roller 34 is a guide roller 32. The guide roller 32 is a split roller, the multiple roller surfaces of which are formed of a flexible material. As indicated in FIG. 2, the guide roller 32 is comprised of a hollow spray pipe 54 forming a shaft, and along which spraying nozzles are spaced at regular intervals, and flexible rollers 55 located between the spraying nozzles and rotatably mounted on the shaft.

The guide roller 32 thus has the functions of a split roller and a spray shaft.

As indicated in FIG. 1, above guide roller 34 and below guide roller 44, brushes 160 are respectively disposed that serves as a rubbing means. These brushes 160 are rotated about their axes by a drive means not indicated in the figures.

Located between the guide roller 28 and the guide rollers 48 is a guide roller 30 which has a diameter larger than those of the guide rollers 24 through 40. This guide roller 30 is rotatably supported by side plates in the same manner as the guide rollers 24 through 46, and the shaft of this guide roller 30 has a guide 52 mounted through a bracket 50. One end of this guide 52 is disposed in the direction of the pair of conveyor rollers 48 so that the end of the PS plate 12 sent from the large-diameter guide roller 30 does not slip as it is guided to the conveyor path, and so that the end of the PS plate 12 is positively guided to between the pair of conveyor rollers 48.

At the lower portion of the developing tank 14, the pair of guide rollers 48 and the guide roller 32 are arranged so as to convey the PS plate 12 through a radius of curvature of between 250 mm and 400 mm.

Accordingly, the PS plate 12 that has been held and conveyed by the pair of conveyor rollers 22 and inserted into the developing tank 14, is passed between the guide roller 24 and the guide roller 42 and is conveyed and guide downwards by the guide rollers 26, 28 and 30, and inserted to between the conveyor rollers 48 by the guide 52. After having passed between the pair of conveyor rollers 48, the PS plate 12 is guided upwards by the guide rollers 32, 34, 36, 38 and 40, and is further guided by guide roller 46 which sends the PS plate 12 upwards and out of the developing tank 14 and into the developing solution recovery tank 16. Moreover, because the PS plate 12 is supported by the guide rollers 34 and 44, the surfaces of the PS plate 12 can be thoroughly rubbed by the brushes 160. The brushes 160 are rotated in the same manner as the pair of conveyor rollers 48, by the drive force of a drive means not indicated in the figures. In this way, the PS plate 12 is developed by being soaked in the developing solution contained within the developing tank 14.

Therefore, the PS plate 12 is conveyed smoothly and with no excessive force applied to it.

The wall forming the downstream end (with respect to the direction of conveyance of the PS plate 12), of the developing tank 14 is bent outwards to form a lip of which the heights of its top and bottom parts are lower than the side walls on the upstream side (with respect to the direction of conveyance of the PS plate 12). Therefore, any overflowing developing solution overflows into the developing solution recovery tank 16 and is recovered.

The spray pipe 54 that forms the shaft for the guide roller 32 and along which multiple spray nozzles are formed, is connected to one end of a pipe 58. The other open end of the pipe 58 is fixed to an opening in the bottom of the developing tank 14. A circulating pump 56 is located along the pipe 58 and thus, the developing solution contained in the developing tank 14 can be supplied to the spray pipe 54.

Also, a spray pipe 60 is located above the guide roller 32. This spray pipe 60 also has a plurality of spray nozzles formed along it, and is also connected to the pipe 58 so that the developing solution contained in the developing tank 14 is also supplied to it by the operation of the circulating pump 56.

The spray nozzles of the spray pipe 54 and the spray pipe 60 face the nip between the pair of conveyor rollers 48 so as to spray the developing solution supplied by the circulating pump 56, in that direction.

Furthermore, a developing solution refilling tank 62 is connected by one end of a pipe 64, along which is a solution refilling pump 66, with the other end emptying into the developing tank 14. Moreover, a water supply tank 68 is connected to one end of a pipe 70 along which is a water supply pump 72, with the other end of which empties into the developing tank 14. Through this arrangement, the refill developing solution (concentrate) in the developing solution refilling tank 62 and the water in the water supply tank 68 are supplied to the developing tank 14 in the required proportion.

Moreover, one end of a pipe 74 empties into the developing tank 14. The other open end of this pipe 74 along which there is a pump 76, is fixed to an opening in the bottom of the developing solution recovery tank 16. Through this arrangement, the developing solution that has over-flowed into the developing solution recovery tank 16 is recovered and returned to the developing tank 14.

Moreover, one end of a drainage pipe 78 is fixed to an opening in the bottom of the developing tank 14 with the other end of this drainage pipe 78 being connected to a drainage tank 80. Located along this drainage pipe 78 is a valve 82 and by opening this valve 82, the developing solution in the developing tank 14 can be discharged to the drainage tank 80. Moreover, one end of a drainage pipe 84 is fixed to an opening in the bottom of the drainage tank 80. Located along this drainage pipe 84 is a valve 86 and by opening this valve 86, the developing solution in the developing solution recovery tank 16 can be discharged to the drainage tank 80.

The circulation pump 56, the refill pump 66, the water supply pump 72 and the pump 76 are connected to, and controlled and driven by a control device 88 provided on the photo-sensitive printing plate automatic developing apparatus 10.

The insertion side of the conveyor rollers 22 is provided with a detector 90 connected to the control device 88. This detector 90 detects the time the PS plate 12 takes to pass the insertion inlet of the photo-sensitive printing plate automatic developing apparatus 10. The control part 88 uses a preset PS plate processing speed and PS plate width to calculate the area of the PS plate 12 inserted into the photo-sensitive printing plate automatic developing apparatus 10.

Also, along the pipe 58 is a fatigue detector 92 that measures the impedance of the developing solution and therefore determines the degree of fatigue of the developing solution. This fatigue detector 92 is also connected to the control device 88.

Also, a paper detector sensor 94 is located on the side of the pair of conveyor rollers 22 from which the PS plate 12 is inserted. This paper detector sensor 94 is connected to the control device 88 and sends electrical signals to the control device 88 when it detects that paper is attached to the underside of the PS plate 12. A contact type of detect sensor or a non-contact type of detect sensor can be used as the paper detector sensor 94. One type of the contact type of detect sensor has a contact in contact with the underside of the PS plate 12 and a resistor to measure the value for the impedance between its terminals. The fact that the value for the impedance differs greatly according to whether or not there is paper attached, is used to detect whether or not paper is present. Moreover, one type of non-contact type of detect sensor has a photocell to detect the intensity of light that has been illuminated onto the underside of the PS plate 12 and then reflected back. The fact that the value for the intensity differs greatly according to whether or not there is paper attached, is used to detect whether or not paper is present.

The control device 88 is connected to an alarm device 96. This alarm device 96 operates when the control device 88 detects that there is paper attached to the underside of the PS plate 12, and informs the operator of such. A warning buzzer or light can be used as this alarm device 96.

Also, a heater 98 is located on the bottom of the developing tank 14 and heats the developing solution in the developing tank 14 so it is at the required temperature. This heater 98 is arranged parallel to and is longer than the guide rollers so that it can heat the developing solution uniformly for at least across the width of the PS plate 12.

Moreover, the surface of the developing solution in the developing tank 14 is covered by a floating cover 100. This cover 100 prevents deterioration of the developing solution due to the gaseous $CO_2$ in the air being absorbed to neutralize the alkali component of the developing solution. This cover 100 floats on the surface of the developing solution in the developing tank 14 because it is formed of foamed nylon and can also rise and fall with changes in the level of the developing solution.

As indicated in FIG. 1, a pair of (upper and lower) conveyor rollers 102 is located at the top of the side wall portion separating the developing solution recovery tank 16 and the water washing tank 18. This pair of conveyor rollers 102 is supported by a pair of side plates not indicated in the figures. The driving force of a drive means also not indicated in the figures, is transmitted to rotate them. The lower of the conveyor rollers 102 is in contact with a recovery roller 104 located within the developing solution recovery tank 16. Through this arrangement, the developing solution brought by the PS plate 12 and adhering to the conveyor rollers 102, is recovered back into the developing solution recovery tank 16.

Located downstream (with respect to the direction of conveyance of the PS plate 12) within the washing tank 18, is a metal roller 106, that removes the water adhering to the conveyor rollers 102 and returns it to the water washing tank 18.

However, the same effect can be obtained by substituting the metal roller 106 for a roller of rubber or some other material.

Inside the water washing tank 18 and further downstream with respect to the direction of conveyance of the PS plate 12, is located a pair of (upper and lower) conveyor rollers 108. In the same manner as conveyor rollers 102, this pair of conveyor rollers 108 is supported by a pair of side plates not indicated in the figures, and the driving force of a drive means also not indicated in the figures, is transmitted to rotate them.

Accordingly, the PS plate 12 that has been sent from the developing tank 14 is held and conveyed by the pair of conveyor rollers 102, inserted to the nip between the pair of conveyor rollers 108 in the water washing tank 18, and sent to the tank for either rinse or desensitization processing.

A guide roller 112 is located between the pair of conveyor rollers 102 and the pair of conveyor rollers 108, and a spray pipe 114 is located above it. The guide roller 112 formed in the same manner as the guide roller 32, comprising a hollow spray pipe forming a shaft, and along which spraying nozzles are spaced at regular intervals, and flexible rollers located between the spraying nozzles and rotatably mounted on the guide roller 112 thus has the functions of supplying water to the PS plate 12, and of guiding the PS plate 12.

Also, one end of a pipe 110 is fixed to an opening in the bottom of the water washing tank 18 and the other end is connected to the spray pipe 114 and to the spray pipe formed by the shaft of the guide roller 112. The pipe 110 has a circulating pump 116 located along it and the water in the water washing tank 18 is also supplied to the spray pipe 114 and to the split roller 112 so as to wash the PS plate 12. Moreover, a recovery roller 118 is in contact with the lower of the pair of conveyor rollers 102, so that water adhering to the pair of conveyor rollers 102 is recovered back to the water washing tank 18.

Moreover, the water supply tank 68 is connected to one end of a pipe 120, along which is a water supply pump 122, and the other end of which empties into the water washing tank 18. Through this arrangement, the operation of the water supply pump 122 supplies the water in the water supply tank 68 to the water washing tank 18.

Furthermore, one end of a drainage pipe 124 is fixed to an opening in the bottom of the water washing tank 18 and the other end of this drainage pipe 124 is connected to a drainage tank 126. Located along this drainage pipe 124 is a valve 128 and by opening this valve 128, the water in the water washing tank 18 can be discharged to the drainage tank 126.

The circulation pump 116 and the water supply pump 122 are connected to the control device 88 which controls their operation.

Located above the rinse or desensitization processing tank 20, downstream, with respect to the direction of conveyance of the PS plate 12, is a pair of conveyor rollers 130. This pair of conveyor rollers 130 is supported by a pair of side plates not indicated in the figures, and the driving force of a drive means also not indicated in the figures, is transmitted to rotate them.

The PS plate 12 that has been sent from the pair of conveyor rollers 108, is inserted to the nip between the pair of conveyor rollers 130.

Located between the pair of conveyor rollers 130 in the upper part of the rinse or desensitization processing tank 20 and the pair of conveyor rollers 108 in the upper part of the water washing tank 18, is a spray pipe 132 and a guide roller 134 formed in the same manner as the spray pipe 114 and the guide roller 112 respectively, of the water washing tank 18. The spray pipe 132 and the guide roller 134 are both connected to one end of a pipe 136. The other end of the pipe 136 is fixed to an opening in the bottom of the rinse or desensitization processing tank 20. The pipe 136 has a circulating pump 138 located along it and the rinse or desensitization solution in the rinse or desensitization processing tank 20 is supplied to the spray pipe 132 and the guide roller 134 by the operation of the circulating pump 138.

Moreover, one end of a pipe 144 empties into the rinse or desensitization processing tank 20 and the other end of the pipe 144 is connected to a rinse or desensitization solution refill tank 146. The pipe 144 has a circulating pump 148 located along it and the rinse or desensitization solution in the rinse or desensitization solution refill tank 146 is supplied to the rinse or desensitization processing tank 20 by the operation of the circulating pump 148.

Furthermore, one end of a pipe 140 empties into the rinse or desensitization processing tank 20 and the other end of the pipe 140 is connected to the water supply tank 68. The pipe 140 has a circulating pump 142 located along it and the water in water supply tank 68 is supplied to the rinse or desensitization processing tank 20 by the operation of the circulating pump 142.

Still furthermore, one end of a drainage pipe 150 is fixed to an opening in the bottom of the rinse or desensitization processing tank 20 and the other end of this drainage pipe 150 is connected to a drainage tank 152. Located along this drainage pipe 150 is a valve 154 and by opening this valve 154, the rinse or desensitization solution in the rinse or desensitization processing tank 20 can be discharged to the drainage tank 152.

The circulation pump 138, the solution refill pump 148 and the water supply pump 142 are connected to the control device 88 which controls their operation.

The following is an explanation of the operation of the preferred embodiment.

The PS 12 upon which an image has been exposed by the exposing device (not indicated in the figure) is inserted between the pair of conveyor rollers 22 of the photo-sensitive printing plate automatic developing apparatus.

When the PS plate 12 is inserted, the paper detector sensor 94 detects whether or not there is paper attached to the underside of the PS plate 12. If paper is attached, then the conveyance of the PS plate 12 is stopped and an alarm is given simultaneously by the alarm device 96.

If there is no paper attached, the pair of conveyor rollers 22 sends the PS plate 12 downwards at an angle of 15° to the horizontal. The PS plate 12 is then guided into the developing tank 14 by the guide roller 42 and the guide roller 24. The PS plate 12 that has been sent into the developing tank 14 is then guided by the guide roller 26 and the guide roller 28 and lowered to reach the guide roller 30 which guides it to the middle of the developing tank 14.

The conveyor path that the PS plate 12 is conveyed to the middle of the developing tank 14 has a substantially V-shape and the radius of curvature of the conveyor path in the vicinity of the guide rollers 26 and 28 is large, but gradually decreases in the vicinity of the guide roller 30.

The radius of curvature becomes smallest in the vicinity of the middle of the developing tank 14 but the end of the PS plate 12 is guided by the guide 52 and is smoothly inserted to the nip between the pair of conveyor rollers 48. This pair of conveyor rollers 48 holds and conveys the PS plate 12 and also functions as the squeeze rollers to squeeze the PS plate 12 to promote the developing of the surface of the PS plate 12. The PS plate 12 that has been sent from the pair of conveyor rollers 48, is guided by the guide roller 32 and at the same time sprayed with the developing solution by the spray pipes 54 and 60 so that the surface of the PS plate 12 is developed. The PS plate 12 is then guided by the guide rollers 34, 36 and 38 and any residual photosensitive film on the surface of the PS plate 12 is completely removed by rotating the brushes 160 that rub the surfaces of the PS plate 12. The PS plate 12 is then guided upwards by the guide rollers 40, 44 and 46 and is sent out from the developing tank 14.

Furthermore, the PS plate 12 is sprayed with the developing solution in the developing tank 14 by the spray pipes 54 and 60, and the developing solution sprayed by these spray pipes 54 and 60 is mixed with the developing solution in the developing tank 14, circulated through the pipe 58 by the circulating pump 56, and sprayed again from the spray pipes 54 and 60.

The surface of the developing solution is covered by the floating cover 100 which prevents deterioration of the developing solution due to the gaseous $CO_2$ in the air being absorbed to neutralize the alkali component of the developing solution.

The PS plate 12 sent from the developing tank 14 is held and conveyed by the pair of conveyor rollers 102 of the developing solution recovery tank 16 so that the developing solution adhering to the PS plate 12 is removed by the pair of conveyor rollers 102. The developing solution that is removed is passed to the recovery roller 104 that is in contact with the lower of the pair of conveyor rollers 102, and is recovered to the developing solution recovery tank 16. Moreover, developing solution that overflows into the developing solution recovery tank 16 when the solution refilling pump 66 operates to add developing solution (concentrate) from the developing solution refilling tank 62 and when the water pump 72 operates to add water from the water supply tank 68, is also recovered to the developing tank 14 through the pipe 74 and the operation of the pump 76.

The PS plate 12 that has been sent from the pair of conveyor rollers 102 is guided by the guide roller 112 and inserted to between the pair of conveyor rollers 108.

Accordingly, the PS plate 12 that is being conveyed, is sprayed with water by the spray pipe 114 and the spray pipe formed by the shaft of the guide roller 112. This water washes off developing solution and deposition attached to either side of the PS plate 12.

The PS plate 12 that has been sent from the pair of conveyor rollers 108 is guided by the guide rollers 134 and inserted to between the pair of conveyor rollers 130. However, prior to being inserted to the nip between the pair of conveyor rollers 130, rinsing solution is applied to both sides of the PS plate 12 by the spray pipe 132 and the spray pipe that forms the shaft of the guide roller 134. The application of this rinsing solution protects the surfaces of the PS plate 12.

Developing solution fatigue will occur if developing processing is performed for many PS plates. An estimate for the degree of fatigue of the developing solution can be calculated by the control device 88 from the PS plate areas detected by the detector 90. However, this method does not take into account the fact that the degree of fatigue of the developing solution changes in accordance with the ratio of image portions to non-image portions of the PS plates (in that the degree of fatigue is greater for greater areas of image portions), and also in accordance with the amount of gaseous $CO_2$ in the air. Accordingly, the developing solution refill method whereby the detector 92 detects the impedance of the developing solution and where developing solution is refilled when the degree of fatigue reaches a certain level or more, is adopted. However, there are instances where developing solution component deposits or substances dissolving out of the PS plates also adhere to the detector 92 so that an abnormal value of the impedance is detected by the detector 90. For this reason, the combination of the detector 92 and the detector 90 is used so that the degree of fatigue of the developing solution is always detected accurately. On the basis of the results of detection, the control device 88 calculates the periods of time that the developing solution refilling pump 66 and the water supply pump 72 have to be operated, and operates the developing solution refilling pump 66 and the water supply pump 72 so as to supply refill developing solution (concentrate) from the developing solution refilling tank 62 and water from the water supply tank 68 in the required proportions. An alarm is given if an abnormal value is given for the difference between the value for the necessary amount of refill calculated from the PS plate insertion area calculated by the detector 90, and the value for the necessary amount of refill calculated by the detector 92 from the impedance of the developing solution. Alternatively, as described below, the PS plate insertion area is used as the basis for changing the refill method from automatic to manual operation.

This is to say that the detector 90 detects the PS plate insertion area and the results of detection are used as the basis for calculating the periods of operation of the developing solution refilling pump 66 and the water supply pump 72, so that the developing solution refilling pump 66 and the water supply pump 72 are operated so as to supply only the amount of refill developing solution necessary for the area of the PS plate 12.

The water washing tank 18 is refilled with water by the water supply pump 122, and the rinse or desensitization processing tank 20 is refilled in the required proportions, with desensitization solution by the solution refill pump 148, and with water by the water supply pump 142.

The control device 88 controls the supply of the necessary amounts of processing solutions and water to only the amounts in accordance with the area of the PS plate 12.

Figure 4:
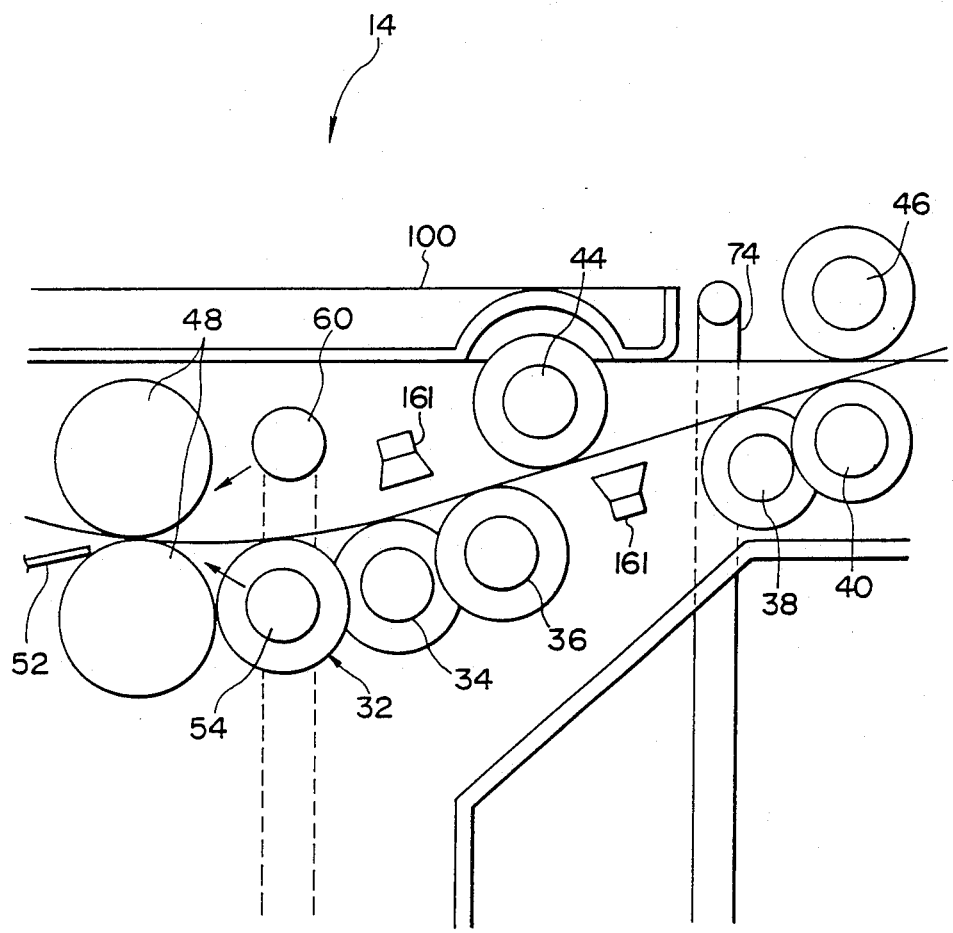
FIG. 4 is a diagrammatic illustration of an ultrasonic vibration device of an embodiment of the present invention.

Moreover, in the embodiment described above, the film-removing device to remove the photo-sensitive film on the plate surface uses the rubbing member but the film-removing device of this invention can be a high-frequency vibration device 161 (see FIG. 4) that removes the photo-sensitive layer by transmitting vibration to the plate surface through the developing solution.

Also, in the above embodiment a presensitized offset printing plate is used as the photo-sensitive printing plate, but in this invention a photo-sensitive printing plate of another type can also be used.

What is claimed is:

1. A photo-sensitive printing plate automatic developing apparatus for developing a photo-sensitive printing plate upon which an image has been exposed, using the developing solution in a developing tank, while conveying said photo-sensitive printing plate along a conveyor path passing through the developing tank from an input side to an output side, and then performing at least one of the following processes of washing, rinsing and desensitizing, comprising:

at least one pair of insertion rollers that hold and convey said photo-sensitive printing plate, said rollers being disposed at said input side at which said photo-sensitive printing plate is inserted into said developing tank, and disposed so as to convey said photo-sensitive printing plate downwards at an angle of 20° or less to the horizontal;

means within said developing tank for conveying said plate comprising at least one pair of squeeze rollers for squeezing and removing used developing solution from the surface of said photo-sensitive printing plate and replacing it with fresh developing solution to promote development, and disposed so as to hold and convey said photo-sensitive printing plate in a state where said photo-sensitive printing plate in said developing solution of said developing tank has its minimum radius of a downward curvature in a range of 200 mm to 900 mm; and a spray means disposed at least one side of above and below the conveyor path of said photo-sensitive printing plate and provided on the downstream side of said pair of squeeze rollers, for spraying fresh developing solution onto the surface of said photo-sensitive printing plate.

2. A photo-sensitive printing plate automatic developing apparatus according to claim 1, wherein a photo-sensitive layer-removing means is provided in at least said developing tank for removing the photo-sensitive layer on the surface of said photo-sensitive printing plate.

3. A photo-sensitive printing plate automatic developing apparatus according to in claim 2, wherein said photo-sensitive layer-removing means comprises at least one of a rubbing member for rubbing a surface of said photo-sensitive printing plate and a high-frequency vibration means to transmit vibration to a surface of said photo-sensitive printing plate through said developing solution.

4. A photo-sensitive printing plate automatic developing apparatus according to claim 3, wherein said rubbing member is a roller-shaped brush that rotates around axis of the brush.

5. A photo-sensitive printing plate automatic developing apparatus according to claim 1, wherein said pair of squeeze rollers are formed from synthetic rubber with a vickers hardness number of between 15 and 60, and have a nip pressure of between 1 kg/cm² and 10 kg/cm².

6. The photo-sensitive printing plate automatic developing apparatus according to claim 1, wherein said spray means sprays the developing solution in the direction of the nip portion of said squeeze rollers.

7. A photo-sensitive printing plate automatic developing apparatus for developing a photo-sensitive printing plate upon which an image has been exposed, using the developing solution in a developing tank, while conveying said photo-sensitive printing plate along a conveyor path passing through the developing tank from an input side to an output side, and then performing at least one of the following processes of washing, rinsing and desensitizing, comprising:

at least one pair of insertion rollers that hold and convey said photo-sensitive printing plate, said rollers being disposed at the input side at which said photo-sensitive printing plate is inserted into said developing tank, and disposed so as to convey said photo-sensitive printing plate downwards at an angle of 20° or less to the horizontal;

means for conveying comprising at least one pair of squeeze rollers for squeezing said developing solution on the surface of said photo-sensitive printing plate and disposed so as to hold and convey said photo-sensitive printing plate in a state where said photo-sensitive printing plate in said developing solution of said developing tank has its minimum radius of a downward curvature in a range of 200 mm to 900 mm; spray means provided on the downstream side of said pair of squeeze rollers for spraying said developing solution onto the surface of said photo-sensitive printing plate, said spray means comprising at least one of a first spray pipe having spray nozzles along its length and a guide roller providing with a second spray pipe constituted in the same manner as said first spray pipe and a rotating member mounted on a periphery of said second spray pipe.

8. A photo-sensitive printing plate automatic developing apparatus according to claim 7, wherein the arrangement of said at least one of said first spray pipe and said guide roller is such that the length of said at least one of said first spray pipe and said guide roller crosses the conveyor path of said photo-sensitive printing plate.

9. A photo-sensitive printing plate automatic developing apparatus according to claim 8, wherein said guide roller is arranged so that said rotating member supports said photo-sensitive printing plate conveyed by said conveying means, from the underside of said photo-sensitive printing plate.

10. A photo-sensitive printing plate automatic developing apparatus according to claim 9, wherein said pair of squeeze rollers are formed from synthetic rubber with a vickers hardness number of between 15 and 60, and have a nip pressure of between 1 kg/cm² and 10 kg/cm².

11. A photo-sensitive printing plate automatic developing apparatus for developing a photo-sensitive printing plate upon which an image has been exposed, in a developing tank while conveying said photo-sensitive printing plate along a conveyor route passing through said developing tank from an input side to an output side, and then performing in a processing tank along said conveyor route at a position downstream of the developing tank at least one of the following processes of washing, rinsing and desensitizing, comprising:

a pair of insertion rollers that hold and convey said photo-sensitive printing plate, said rollers being disposed at said input side at which said photo-sensitive printing plate is inserted into said developing tank, and being arranged so as to convey said photosensitive printing plate downwards at an angle of 20° or less to the horizontal, and a conveying means disposed within said developing tank and comprising a pair of squeeze rollers for squeezing the developing solution on the surface of said photo-sensitive printing plate while holding and conveying said photo-sensitive printing plate in a state where said photo-sensitive printing plate in said developing solution of said developing tank has its minimum radius of a downward curvature in a range of 200 mm to 900 mm;

a pair of conveyor rollers arranged on the downstream side of said conveying means, for holding and conveying said photo-sensitive printing plate horizontally or downwards to said following processing tank after said developing process is completed; and a spray means disposed within said developing tank and provided on the downstream side of said pair of squeeze rollers, for spraying said developing solution onto the surface of said photo-sensitive printing plate, said spray means comprising a hollow shaft having a plurality of nozzles disposed along its axial length and a plurality of rollers disposed along the axial length of said shaft between said nozzles.

12. A photo-sensitive printing plate automatic developing apparatus according to claim 11, wherein said developing tank is provided with a photo-sensitive layer-removing means to remove the photo-sensitive layer on the surface of said photo-sensitive printing plate.

13. A photo-sensitive printing plate automatic developing apparatus according to claim 12, wherein said photo-sensitive layer-removing means comprises at least one of a rubbing member for rubbing a surface of said photo-sensitive printing plate and a high-frequency vibration means to transmit vibration to a surface of said photo-sensitive printing plate through said developing solution.

14. A photo-sensitive printing plate automatic developing apparatus according to claim 13, wherein said rubbing member is a roller-shaped brush that rotates around its axis.

15. A photo-sensitive printing plate automatic developing apparatus according to claim 11, wherein said pair of squeeze rollers are formed from synthetic rubber with a vickers hardness number of between 15 and 60, and have a nip pressure of between 1 kg/cm$^2$ and 10 kg/cm$^2$.

16. A photo-sensitive printing plate automatic developing apparatus according to claim 13, wherein said pair of squeeze rollers are formed from synthetic rubber with a vickers hardness number of between 15 and 60, and have a nip pressure of between 1 kg/cm$^2$ and 10 kg/cm$^2$.

17. The photo-sensitive printing plate automatic developing apparatus according to claim 13, wherein said rubbing member comprises at least one of a rotating member and a reciprocating member.

18. The photo-sensitive printing plate automatic developing apparatus according to claim 17 wherein said rubbing member comprises a natural material of at least one of sponge, cloth and rubber.

19. The photo-sensitive printing plate automatic developing apparatus according to claim 11, wherein said spray means sprays the developing solution in the direction of the nip portion of said squeeze rollers.

20. A photo-sensitive printing plate automatic developing apparatus for developing a photo-sensitive printing plate upon which an image has been exposed, in a developing tank while conveying said photo-sensitive printing plate along a conveyor route passing through said developing tank from an input side to an output side, and then performing in a processing tank along said conveyor route at a position downstream of the developing tank at least one of the following processes of washing, rinsing and desensitizing, comprising:

a pair of insertion rollers that hold and convey said photo-sensitive printing plate on the side in which said photo-sensitive printing plate is inserted into said developing tank and being arranged so as to convey said photo-sensitive printing plate downwards at an angle of 20° or less to the horizontal, and a conveying means comprising a pair of squeeze rollers for squeezing the developing solution on the surface of said photo-sensitive printing plate while holding and conveying said photo-sensitive printing plate in a state where said photo-sensitive printing plate in said development solution of said developing tank has its minimum radius of a downward curvature in a range of 200 mm to 900 mm; and a pair of conveyor rollers arranged on the downstream side of said conveying means, for holding and conveying said photo-sensitive printing plate horizontally and downwards to said following processing after said developing processing is completed; and at least one of a first spray pipe and a split roller disposed on the downstream side of said squeeze rollers, said spray pipe having spraying nozzles along its length for spraying said developing solution onto a surface of said photo-sensitive printing plate and said split roller comprising a second spray pipe having spray nozzles along its length and elastic rotating members disposed on an outer periphery of said second spray pipe and between said spray nozzles adjacent to each other.

21. A photo-sensitive printing plate automatic developing apparatus according to claim 20, wherein said at least one of said first spray pipe and said split roller is arranged in the direction that its length crosses said conveyor path of said photo-sensitive printing plate.

22. A photo-sensitive printing plate automatic developing apparatus according to claim 21, wherein said at least one of said spray pipe and said split roller is provided as a pair, one being disposed above said conveyor path and the other being disposed below said conveyor path.

23. A photo-sensitive printing plate automatic developing apparatus according to claim 22, wherein said split roller is arranged so that said elastic rotating members support said photo-sensitive printing plate conveyed by said conveying means, from the underside of said photo-sensitive printing plate.

* * * * *